United States Patent
Chou

(10) Patent No.: US 7,955,899 B2
(45) Date of Patent: Jun. 7, 2011

(54) METHOD FOR PROVIDING AND REMOVING DISCHARGING INTERCONNECT FOR CHIP-ON-GLASS OUTPUT LEADS AND STRUCTURES THEREOF

(75) Inventor: Chen-Jean Chou, New City, NY (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 100 days.

(21) Appl. No.: 12/551,261

(22) Filed: Aug. 31, 2009

(65) Prior Publication Data

US 2009/0317946 A1    Dec. 24, 2009

Related U.S. Application Data

(62) Division of application No. 11/358,997, filed on Feb. 21, 2006, now Pat. No. 7,582,952.

(51) Int. Cl.
    *H01L 21/768* (2006.01)

(52) U.S. Cl. ............. 438/121; 257/E21.575; 438/694

(58) Field of Classification Search .......... 438/121, 438/123, 694, 699, 200, 275; 257/665, E21.575, 257/E21.51
    See application file for complete search history.

(56) References Cited

U.S. PATENT DOCUMENTS

| | | |
|---|---|---|
| 4,714,949 A | 12/1987 | Simmons et al. |
| 5,019,002 A | 5/1991 | Holmberg |
| 5,175,772 A | 12/1992 | Kahn et al. |
| 5,434,108 A | 7/1995 | Ko et al. |
| 5,559,358 A | 9/1996 | Burns et al. |
| 6,034,480 A | 3/2000 | Browning et al. |
| 6,040,937 A | 3/2000 | Miles |
| 6,365,433 B1 | 4/2002 | Hyoudo et al. |
| RE37,847 E | 9/2002 | Henley et al. |
| 6,543,673 B2 | 4/2003 | Lennard et al. |
| 6,567,715 B1 | 5/2003 | Sinclair et al. |
| 6,674,562 B1 | 1/2004 | Miles |
| 6,777,249 B2 | 8/2004 | Yamazaki |
| 6,950,193 B1 | 9/2005 | Discenzo |
| 7,026,821 B2 | 4/2006 | Martin |
| 7,123,216 B1 | 10/2006 | Miles |
| 7,126,741 B2 | 10/2006 | Wagner et al. |
| 7,187,489 B2 | 3/2007 | Miles |

(Continued)

FOREIGN PATENT DOCUMENTS

EP    0 693 781    1/1996

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner* — Roy K Potter
(74) *Attorney, Agent, or Firm* — Knobbe Martens Olson & Bear LLP

(57) ABSTRACT

Microelectronic devices may be fabricated while being protected from damage by electrostatic discharge. In one embodiment, a shorting circuit is connected to elements of the microelectronic device, where the microelectronic device is part of a chip-on-glass system. In one aspect of this embodiment, a portion of the shorting circuit is in an area of a substrate where a microchip is bonded. In another embodiment, shorting links of the shorting circuit are comprised of a fusible material, where the fusible material may be disabled by an electrical current capable of fusing the shorting links.

14 Claims, 14 Drawing Sheets

U.S. PATENT DOCUMENTS

| | | |
|---|---|---|
| 7,289,256 B2 | 10/2007 | Cummings et al. |
| 7,327,510 B2 | 2/2008 | Cummings et al. |
| 7,359,066 B2 | 4/2008 | Cummings et al. |
| 7,388,704 B2 | 6/2008 | Djordjev |
| 7,411,291 B2 | 8/2008 | Baler et al. |
| 7,415,186 B2 | 8/2008 | Cummings et al. |
| 7,417,735 B2 | 8/2008 | Cummings et al. |
| 7,453,579 B2 | 11/2008 | Kothari et al. |
| 7,545,556 B2 | 6/2009 | Khazeni |
| 7,582,952 B2 | 9/2009 | Chou |
| 2002/0157033 A1 | 10/2002 | Cox |
| 2002/0158348 A1 | 10/2002 | Petrucci et al. |
| 2006/0103643 A1 | 5/2006 | Mathew et al. |
| 2006/0114243 A1 | 6/2006 | Iwasaki |
| 2006/0243023 A1 | 11/2006 | Wong |
| 2008/0088638 A9 | 4/2008 | Miles |
| 2008/0180680 A1 | 7/2008 | Cummings et al. |
| 2008/0303531 A1 | 12/2008 | Cummings et al. |

OTHER PUBLICATIONS

Aratani et al., "Surface Micromachined Tuneable Interferometer Array," Sensors and Actuators, pp. 17-23 (1994).

Conner, "Hybrid Color Display Using Optical Interference Filter Array," SID Digest, pp. 577-580 (1993).

Durr et al., "Reliability Test and Failure Analysis of Optical MEMS", Proceedings of the 9th International Symposium on the Physical and Failure Analysis of Integrated Circuits, pp. 201-206, (Jul. 8-12, 2002).

Raley et al., "A Fabry-Perot Microinterferometer for Visible Wavelengths," IEEE Solid-State Sensor and Actuator Workshop, Hilton Head, SC (1992).

Skaggs et al, "Automatic Testing of the Digital Micromirror Device", IEEE/LEOS 1996 Summer Topical Meetings, pp. 11-12, (Aug. 5-9, 1996).

Srikar et al., "A Critical Review of Microscale Mechanical Testing Methods Used in the Design of Microelectromechanical Systems," Society for Experimental mechanics, vol. 43, No. 3, (2003).

ISR and WO for PCT/US07/002754 filed Feb. 1, 2007.

IPRP for PCT/US07/002754 filed Feb. 1, 2007.

Office Action dated Jan. 22, 2009 in U.S. Appl. No. 11/358,997.

METHOD FOR PROVIDING AND REMOVING DISCHARGING INTERCONNECT FOR CHIP-ON-GLASS OUTPUT LEADS AND STRUCTURES THEREOF

CROSS-REFERENCE TO RELATED APPLICATIONS

This application is a divisional of and claims priority to U.S. patent application Ser. No. 11/358,997, filed on Feb. 21, 2006, which is herein incorporated by reference in its entirety.

BACKGROUND OF THE INVENTION

1. Field of the Invention

This invention relates to the manufacture of chip-on-glass devices. More particularly, this invention relates to improved systems and methods for preventing damage due to electrostatic discharge during the manufacturing process.

2. Description of Certain Related Technologies

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

MEMS devices, as well as other forms of micro-circuitry including, e.g., LCD devices and OLED devices, may be damaged during manufacture due to electrostatic discharge (ESD). ESD may occur when two proximate electrodes have different respective electrostatic charge levels. In order to prevent ESD, all leads that are in proximity of each other and are connected to micro-circuitry susceptible to damage by ESD should be electrically connected to a common shorting circuit.

Prevention of ESD in manufacturing commonly includes the use of a shorting bar in TAB (Tape Automated Bonding) configuration. All the elements are connected to the shorting bar with electronic leads that will later drive the elements being protected from ESD. After the manufacturing process has concluded, the leads are cut using a saw or a scribe and break technique. The leads are then bonded to a TAB circuit built on a flexible material, such as polyimide. The TAB connects the display to driver chips between the glass of the display and the input circuitry behind the display.

As device geometry is being continuously reduced for lower cost and lighter weight, the COG (chip-on-glass) approach has become a favored configuration. The configuration of I/O bond pads used for the COG approach does not lend itself to the use of a single shorting bar in TAB configuration. Any mechanical cutting in the bonding area is prohibited. There is also very little space in the boding area for routing all the leads. This is especially true for display devices with large numbers of rows and columns.

Previous methods of preventing ESD in conjunction with a COG configuration have compromised on the ESD protection by utilizing partial shorts. Other methods have utilized crossover structures in routing links to shorting bars which complicates the fabrication process and adds cost. What is needed is a method of providing ESD protection during a manufacturing process for fabricating devices including a COG configuration.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display device solutions.

An embodiment provides a partially fabricated microelectronic device including an array of electronic devices on a substrate with conductive leads connecting to the electronic devices, where at least two leads connect to each electronic device. This embodiment further includes a shorting structure, and a plurality of shorting links in electrical connection with the conductive leads and the shorting structure. In one aspect of this embodiment, the shorting structure or the shorting links are at least partially located in a microchip bonding area of the substrate and the shorting links or the shorting structure are configured so as to be at least partially removable.

Another embodiment provides a partially fabricated display unit including a display array comprised of a plurality of display elements arranged upon a substrate, and conductive leads connecting to the display elements, where at least two leads connect to each display element. The embodiment further includes a plurality of shorting links in electrical connection with the conductive leads and configured such that all of the conductive leads are electrically connected. In one aspect of this embodiment, the shorting links are comprised of a fusible material and are configured so as to be disabled by an electrical current capable of fusing the shorting links.

Another embodiment provides a display device including a display array including of a plurality of display elements arranged upon a substrate and conductive leads connecting to the display elements, where at least two leads connect to each display element. The device further includes a shorting structure, an electronic device comprising contacts in electrical connection with the conductive leads, and a plurality of fused shorting links.

Another embodiment provides a method of providing electrostatic discharge protection during a fabrication process of a micro-electronic device, where the microelectronic device comprises an array of electronic devices on a substrate. The method includes applying a plurality of conductive leads to the substrate, where the leads connect to the electronic devices. The method further includes applying an electrically conductive material to the substrate to serve as a shorting structure, applying shorting links to the substrate, where the shorting links are comprised of an electrically conductive material and are in electrical connection to the conductive leads and the shorting structure. In one aspect of this embodiment, the shorting structure is at least partially located in an area of the substrate to attach a microchip. In another aspect of this embodiment, at least one of the group of shorting links or the shorting structure is configured so as to be at least partially removable.

Another embodiment provides a method of providing electrostatic discharge protection during a fabrication process of a micro-electronic device, where the microelectronic device comprises an array of electronic devices on a substrate. The method includes applying a plurality of conductive leads to the substrate, wherein the leads connect to the electronic devices. The method further includes applying shorting links to the substrate in electrical connection with the conductive leads, and configuring the shorting links such that all of the conductive leads are connected to a single shorting circuit. In one aspect of the embodiment, the shorting links are comprised of fusible material and are configured so as to be disabled by an electrical current capable of fusing the shorting links.

BRIEF DESCRIPTION OF THE DRAWINGS

FIGS. 1 through 12 are not drawn to scale.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

An embodiment provides a method of providing ESD protection during manufacture of a display device including an interformetric modulator display. In one aspect of the embodiment, the display device is a COG system. In another aspect of the embodiment, circuitry providing the ESD protection may be removed by applying an electrical current capable of fusing the circuitry.

Figure 1:
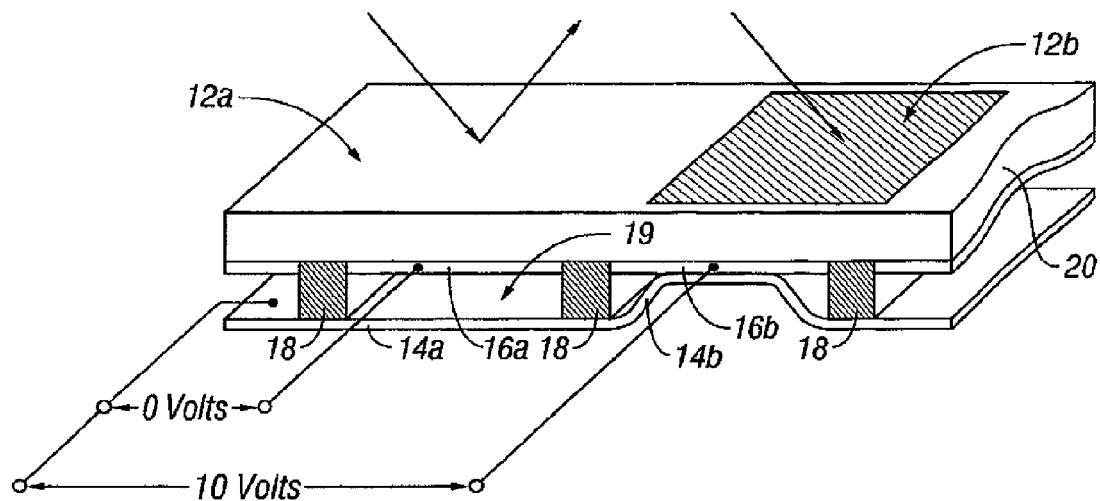
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. An the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
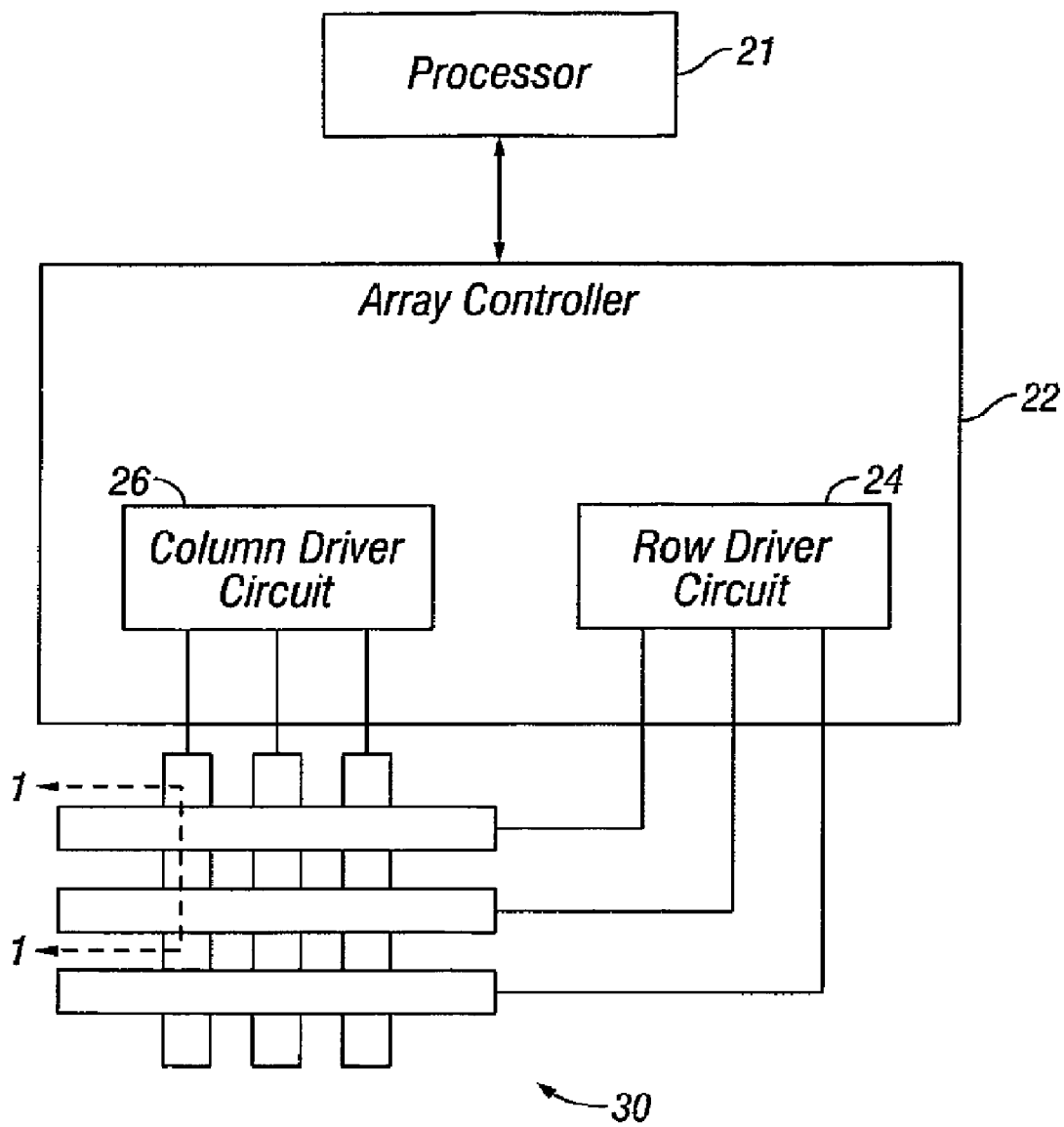
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, his stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
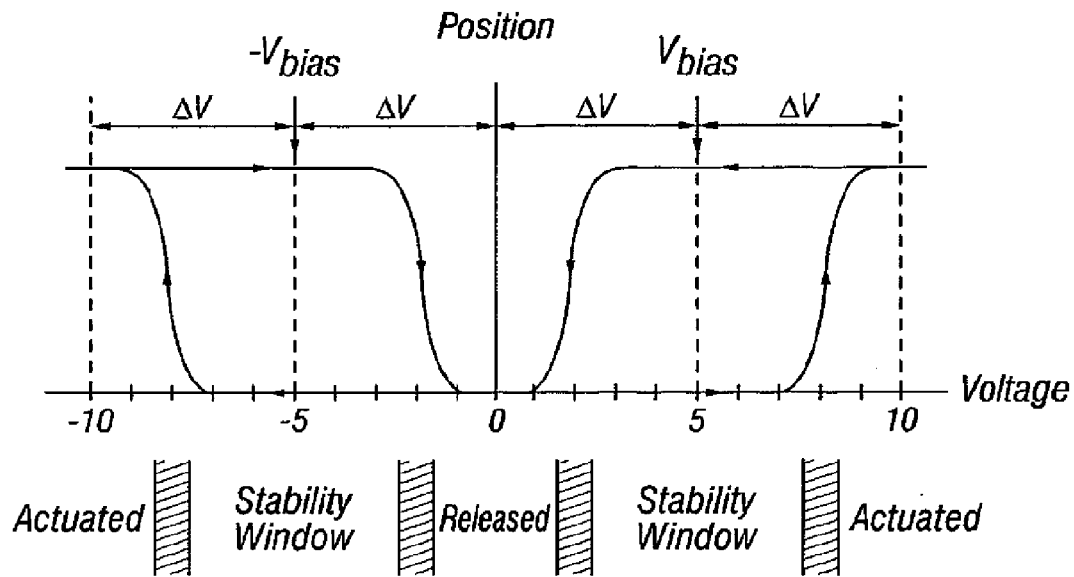
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
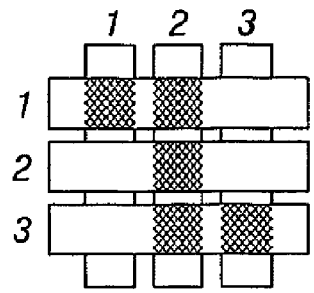
FIG. 5A illustrates one exemplary frame of display data in the 3×3 interferometric modulator display of FIG. 2.
Figure 5B:
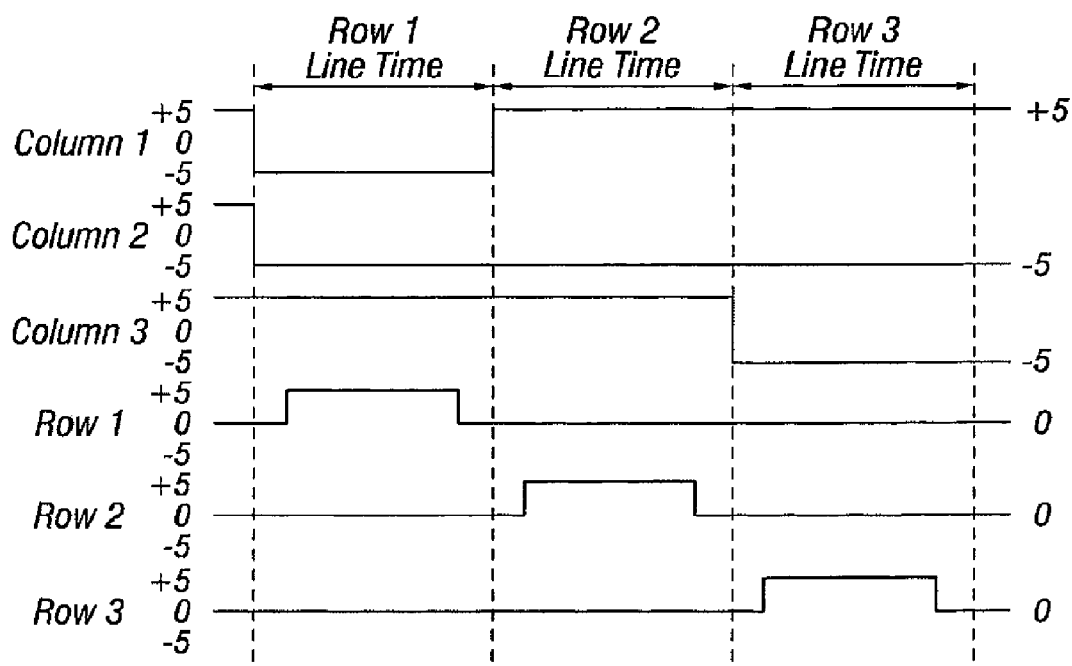
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

It is during the manufacture of driving circuitry connected to the row and column electrodes pictured in FIG. 5a, that ESD may damage elements such as interferometric modulators. If electrostatic charges in rows and columns are not equal, then the display element at the juncture of the unequally charged rows could be susceptible to ESD. Embodiments of the invention discussed in detail below may protect interferometric modulators from being damaged by ESD during manufacturing processes.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
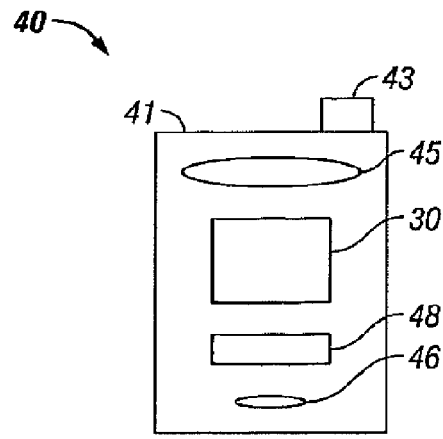
FIGS. 6A and 6B are system block diagrams illustrating an embodiment of a visual display device comprising a plurality of interferometric modulators.
Figure 6B:
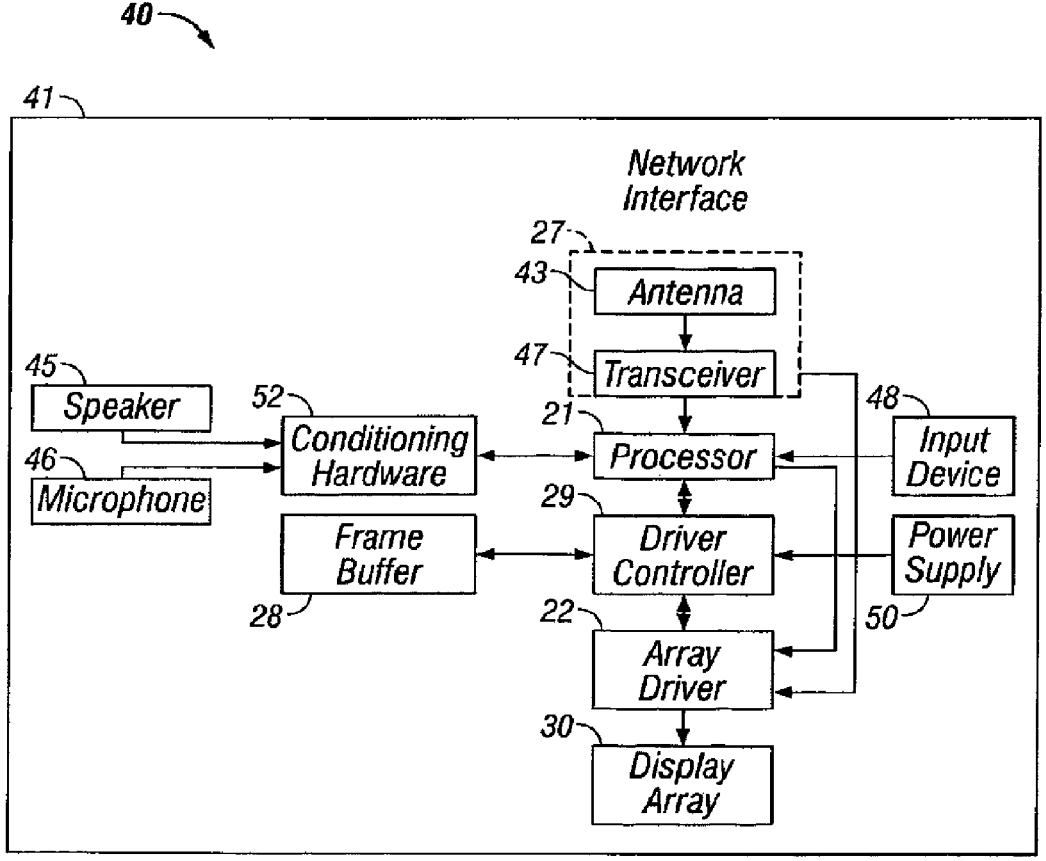

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device such as a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21.or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
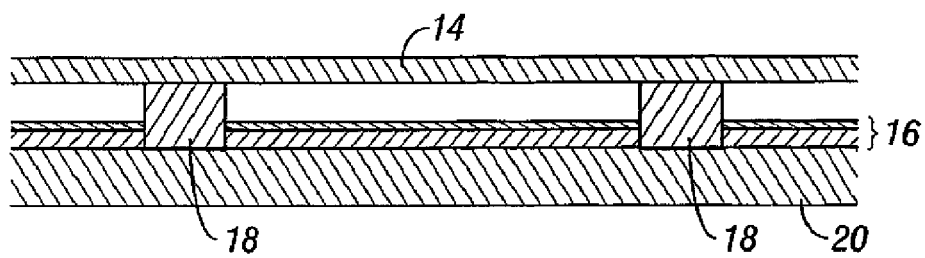
FIG. 7A is a cross section of the device of FIG. 1.
Figure 7B:
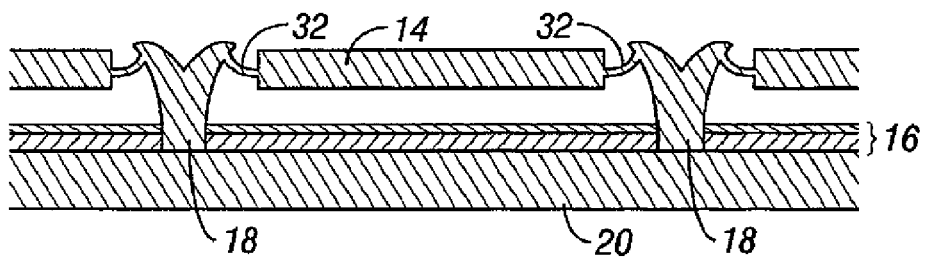
FIG. 7B is a cross section of an alternative embodiment of an interferometric modulator.
Figure 7C:
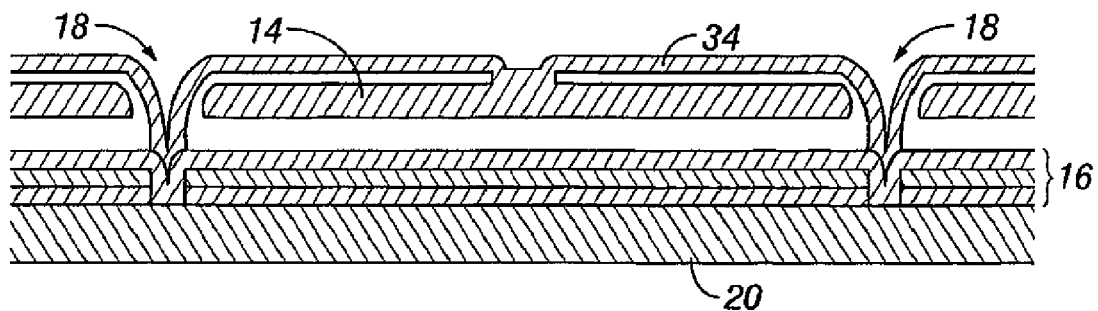
FIG. 7C is a cross section of another alternative embodiment of an interferometric modulator.
Figure 7D:
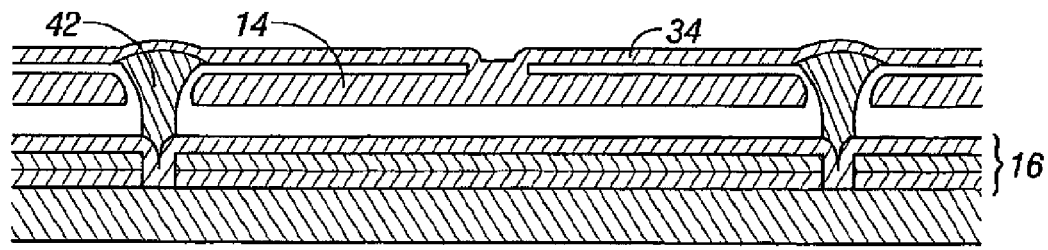
FIG. 7D is a cross section of yet another alternative embodiment of an interferometric modulator.
Figure 7E:
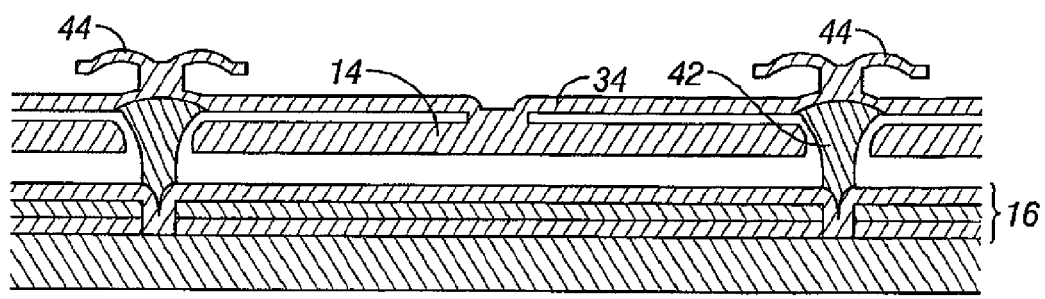
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

During manufacture of MEMS devices and other types of microelectronics, ESD may damage components of the device. In order to provide protection against ESD, temporary circuitry may be added during the manufacturing process and later removed and/or disabled at some point in the manufacturing process. The temporary circuitry is designed to keep elements in close proximity at the same or similar level of electrostatic potential. By assuring that all elements are at the same or similar potential, damage due to ESD may be avoided. By removing and/or disabling the temporary circuitry, the short circuits that were protecting against ESD are removed thus allowing the leads, such as the row and column driver electrodes discussed above, to drive the display array 30 in the finished product.

Figure 8:
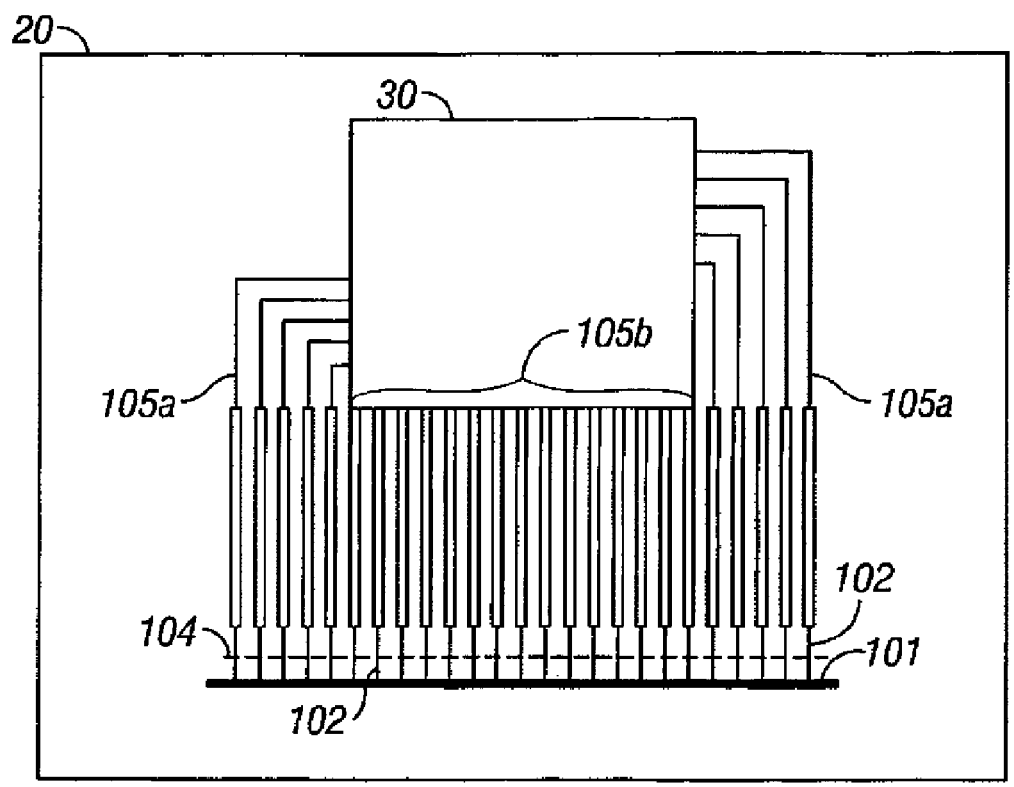
FIG. 8 illustrates an example of a shorting bar configuration used for providing ESD protection during a manufacturing process.

FIG. 8 illustrates an example of a shorting bar configuration commonly used for providing ESD protection during a manufacturing process. The configuration shown comprises a plurality of leads 105 deposited on the substrate 20. Each lead 105 is connected to the shorting bar 101 with shorting links 102. The shorting links 102 are the temporary circuitry providing ESD protection. The leads 105 include row leads 105a and column leads 105b connected to the row and column electrodes of the display array 30. The leads 105 may remain to become the circuits that transmit the display signal outputs from driver controller 29 and array driver 22 to the display array 30. After the manufacturing process has progressed to a point where risk of ESD is manageable, the shorting links 102 may be disabled by sawing or scribing and breaking along scribe line 104. The shorting bar 101, the shorting links and the substrate upon which they are deposited are removed. After removal of the shorting links 102 and the shorting bar 101 a flexible TAB foil containing output leads from array driver 22 may be bonded to the leads 105. Array driver 22 may be a COF (chip-on-foil) configured microchip.

Embodiments of the invention improve upon the ESD protection provided by the configuration shown in FIG. 8. Disadvantages of the TAB approach include its possible incompatibility with chip-on-glass type devices. In a COG device, the substrate may need to be present and undamaged in order to mount the chip on bond pads. Any scribe and break or sawing may not be satisfactory. In one embodiment, the invention utilizes a fusible material when depositing shorting links between leads of an electronic device and a shorting bar. In this embodiment the shorting links may be disabled by fusing, burning and/or melting the links. The disabling in this embodiment may comprise an electrical current for fusing the shorting links.

In another embodiment of the invention, a shorting structure is deposited in proximity to a bonding area of a COG system. Shorting links are deposited in the bonding area connecting leads to the shorting structure. In one aspect of this embodiment, the leads are output leads to be used in driving a display array. In another aspect of this embodiment, the shorting links are comprised of a fusible material. In yet another aspect of this embodiment, the shorting links are disabled by a fusing current.

Figure 9:
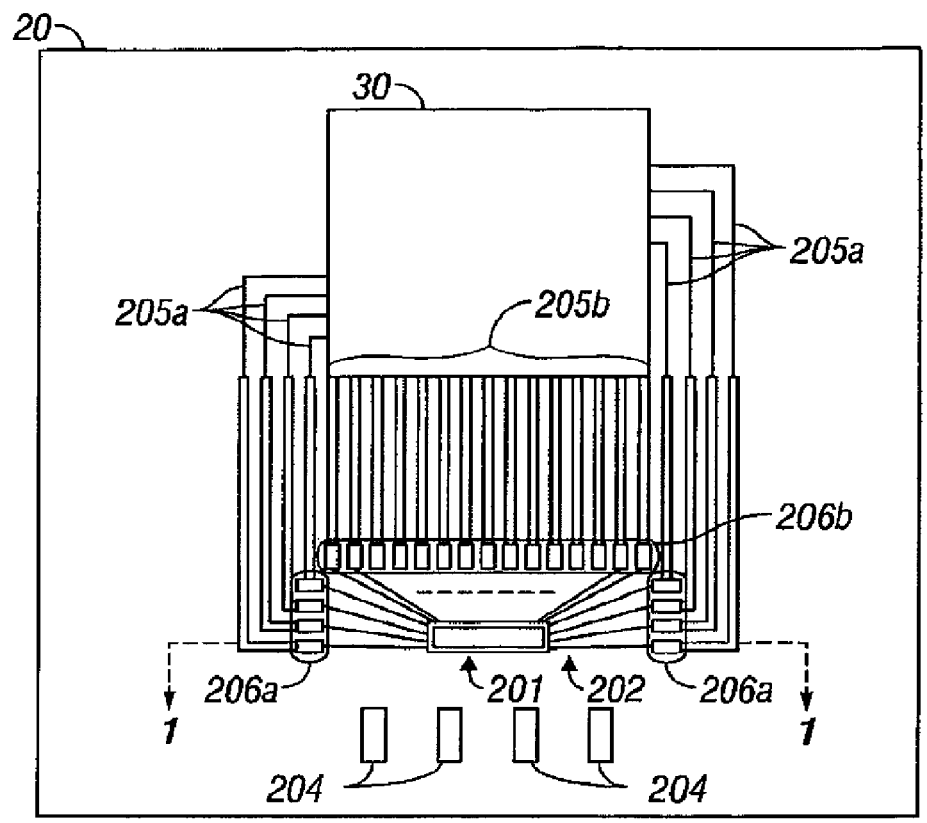
FIG. 9 illustrates an embodiment for providing ESD protection during manufacture of a Chip-on-Glass system.
Figure 10:
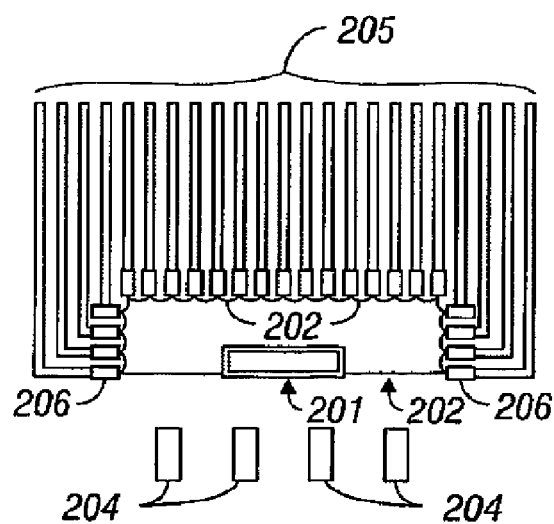
FIG. 10 illustrates another embodiment for providing ESD protection during manufacture of a Chip-on-Glass system.
Figure 11A:
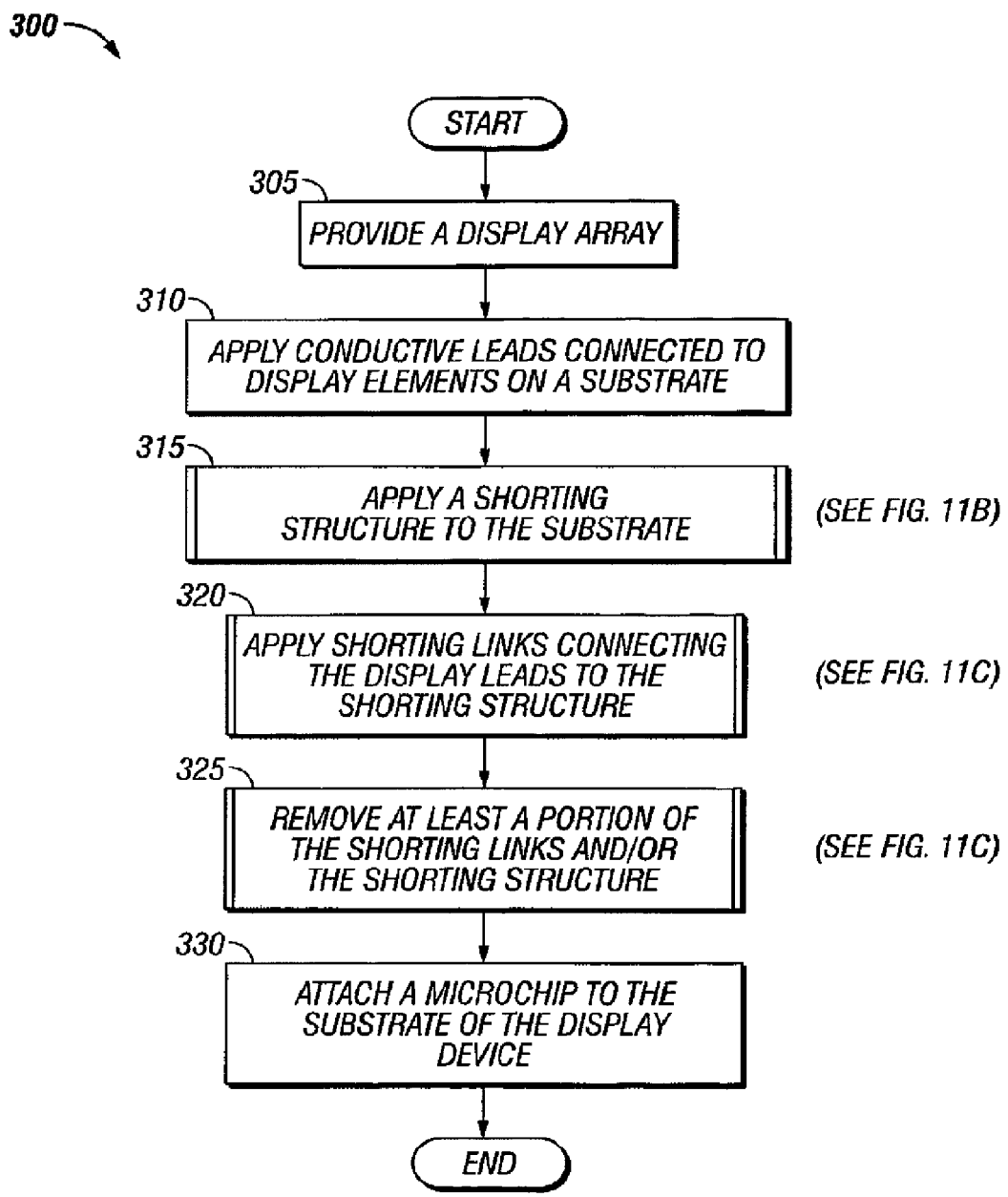
FIG. 11A is a flow diagram illustrating certain steps in a manufacturing process for providing for ESD protection of hardware susceptible to ESD during a manufacturing process.

Details of these and other embodiments will now be discussed. FIGS. 9 and 10 illustrate embodiments for providing ESD protection during manufacture of a microelectronic device, e.g., a COG system. FIG. 11a is a flow diagram illustrating certain steps in a manufacturing process for providing ESD protection of hardware susceptible to ESD during the manufacturing process. FIGS. 12a through 12h schematically illustrate an embodiment of a method for fabricating the circuitry for providing the ESD protection. The cross section illustrated in FIG. 12 is designated by the lines 1-1 in FIG. 9. With reference to FIGS. 9, 10, 11a and 12 process 300 starts at step 305 providing a display array 30 on a substrate 20. Display array 30 comprises an array of display elements such as interferometric modulators. In other embodiments, the display elements may be LCD devices or OLED devices. Devices other than display arrays may be protected against ESD in other embodiments. The display array 30 is only an exemplary device that can be protected from ESD using process 300. The substrate 20 may be a transparent substrate such as glass or plastic.

Figure 12A:
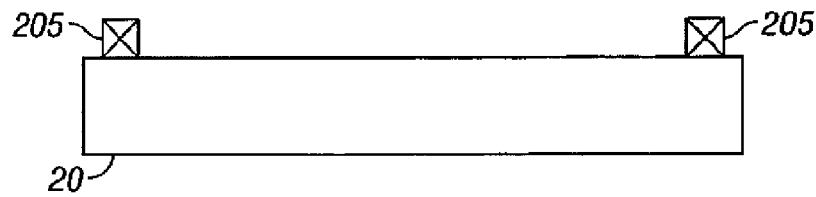
FIGS. 12A through 12H schematically illustrate an embodiment of a method for fabricating circuitry for providing ESD protection of certain hardware during a manufacturing process.

Process 300 continues at step 310 where conductive leads 205 are deposited on the substrate 20, as depicted schematically in FIG. 12a. Conductive leads 205 may comprise row leads 205a and column leads 205b. The row leads 205a and column leads 205b connect to row and column electrodes, respectively, that intersect at individual display elements or pixels of the display array 30. The conductive leads 205 may be deposited on the substrate 20 by deposition techniques such as physical vapor deposition (PVD, e.g., sputtering), plasma-enhanced chemical vapor deposition (PECVD), or thermal chemical vapor deposition (thermal CVD). The conductive leads may be comprised of electrically conductive materials such as, e.g., aluminum, nickel or molybdenum. Printing techniques such as inkjet deposition or photolithography may be used to define the patterns (lines) for the conductive leads.

Figure 12B:
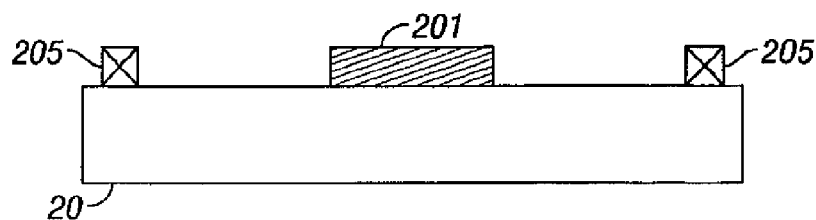
Figure 12C:
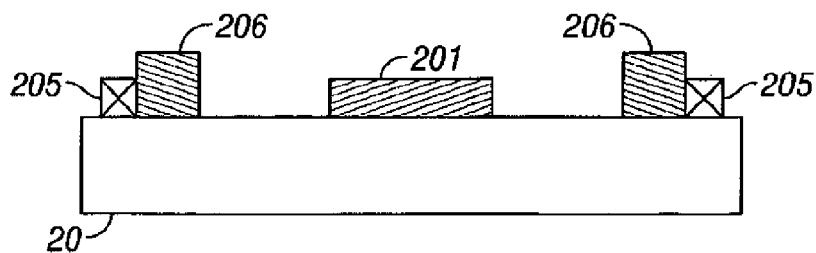

Process 300 continues at step 315 where a shorting structure 201 is deposited onto the substrate 20, as depicted schematically in FIG. 12b. The shorting structure 201 may be deposited on the substrate 20 by deposition techniques such as physical vapor deposition (PVD, e.g., sputtering), plasma-enhanced chemical vapor deposition (PECVD), or thermal chemical vapor deposition (Thermal CVD). Printing techniques such as inkjet deposition or photolithography may be used to define the patterns (lines) for the conductive leads. The shorting structure may be in the form of a bar or a ring, but other forms may also be provided. The form serves to enable the shorting links to be connected to the common shorting structure, thereby forming a single shorting circuit. The shorting structure 201 is comprised of electrically conductive material. In one embodiment, the shorting structure is comprised of an etchable material such as, titanium, tungsten, tantalum or molybdenum. In this embodiment, as discussed below, the shorting structure may be etched away, thereby disabling the shorting circuit provided by the shorting links and shorting structure combined.

Figure 11B:
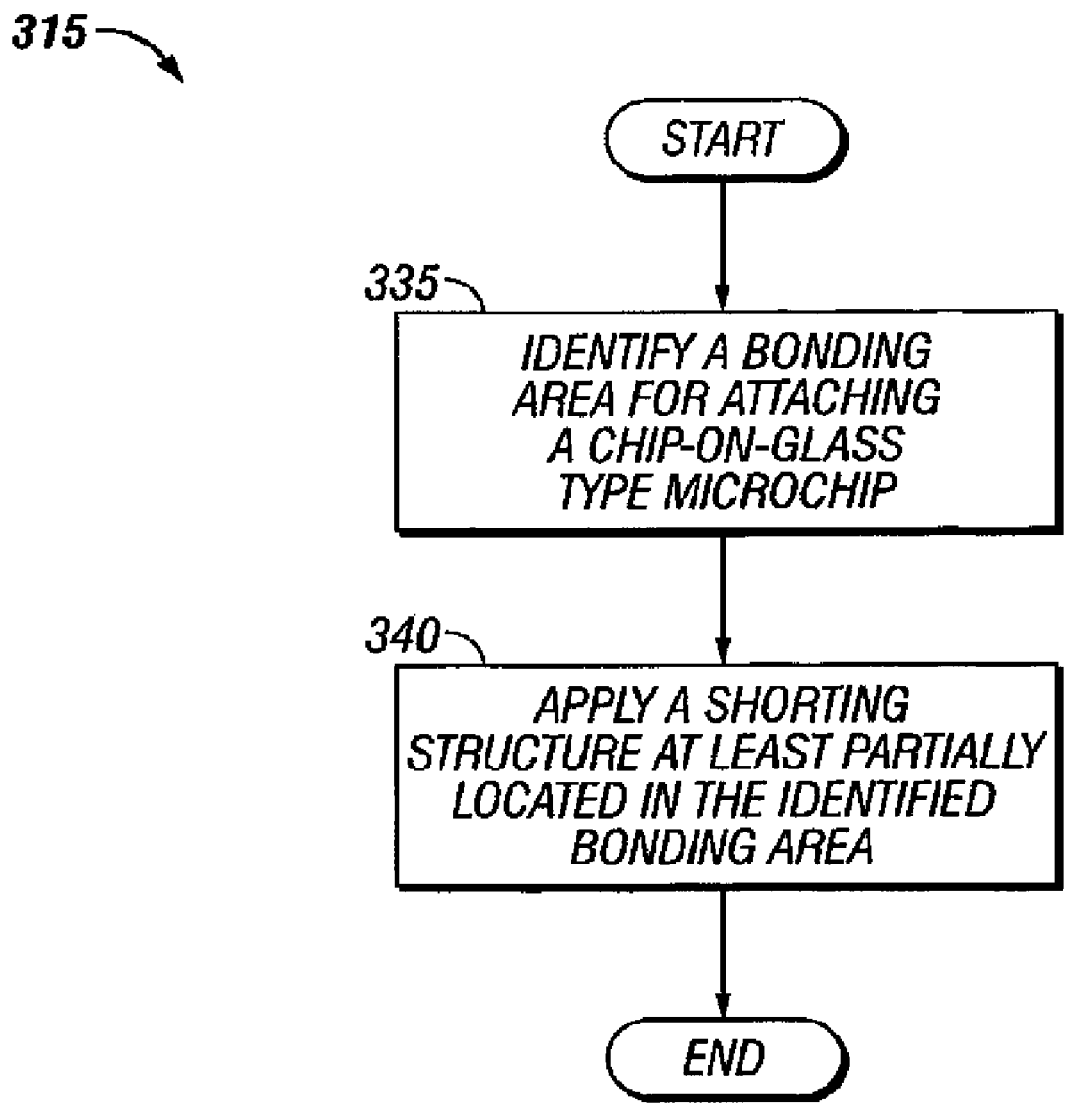
FIGS. 11B and 11C are flow diagrams illustrating certain alternative steps that may be used in the manufacturing process of FIG. 11A.

The shorting structure may be located, at least partially, in a bonding area of a COG system as in the embodiment shown in FIG. 9. FIG. 11b illustrates alternative sub-steps, steps 335 and 340, making up step 315 for this embodiment. At step 335, an area of the substrate is identified for attaching a COG-type chip, the area being known as the bonding area. The bonding area of a COG system generally includes input bond pads 204 and output bond pads 206. The input bond pads 204, when bonded to a microprocessor chip, provide input signals to the microprocessor chip. Output bond pads 206 may be deposited in electrical connection with the conductive leads 205, as depicted schematically in FIG. 12c. The output bond pads 206 may be deposited on the substrate 20 by deposition techniques such as physical vapor deposition (PVD, e.g., sputtering), plasma-enhanced chemical vapor deposition (PECVD), thermal chemical vapor deposition (thermal CVD), or inkjet deposition. Since the geometry may be relatively large in this area, other techniques such as foil coating may also be used. The input signals may include image data to be displayed on the display array 30. The microprocessor chip may include array driver 22. The output bond pads 206 may provide electrical signals, output by the array driver 22, to the row and column electrodes of the display array 30. Row output bond pads 206a are connected to the row electrodes via the conductive leads 205a, and column output bond pads 206b are connected to the column electrodes via the conductive leads 205b. At step 340, shorting structure 201 is deposited at least partially located in the identified bonding area.

Figure 12D:
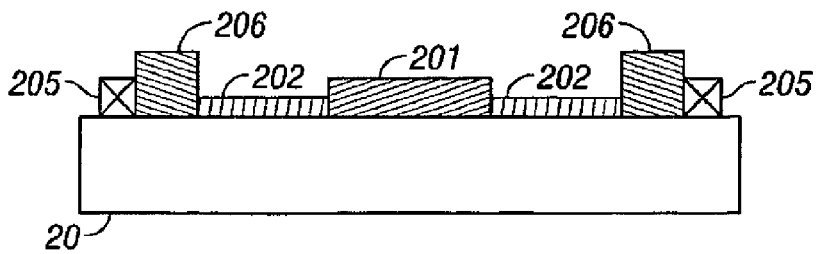
Figure 12E:
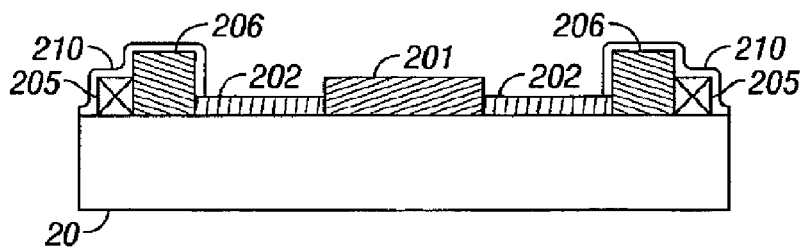
Figure 12F:
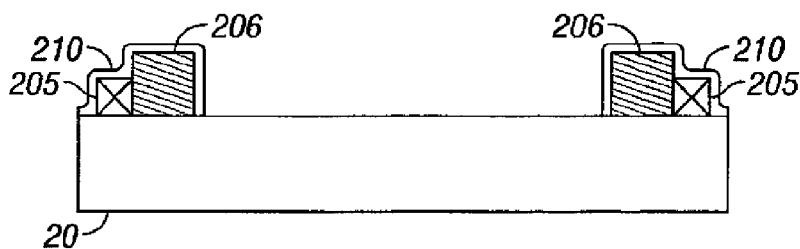

Process 300 continues at step 320 where shorting links 202 are applied to the substrate 20, thereby connecting the conductive leads 205 electrically to the shorting structure 201, as depicted schematically in FIG. 12d. The shorting links 202 may be deposited on the substrate 20 by deposition techniques such as physical vapor deposition (PVD, e.g., sputtering), plasma-enhanced chemical vapor deposition (PECVD), thermal chemical vapor deposition (thermal CVD), printing or plating. Photolithography may be used for defining the pattern of the shorting links 202. The shorting links 202 are comprised of an electrically conductive material. In one embodiment, the shorting links 202 are comprised of a fusible material and are configured so as to be disabled by an electrical current capable of fusing the shorting links 202. In another embodiment, the shorting links 202 are comprised of an etchable material and may be removed, at least partially, by dry chemical etching, wet etching, plasma etching or laser etching methods.

FIG. 10 shows another embodiment of shorting link configuration to that shown in FIG. 9. In FIG. 10, the shorting links 202 connect from one output bond pad 206 to another output bond pad 206 (or from one conductive lead 205 to another conductive lead 205, in certain embodiments). FIG. 10 shows the shorting structure 201 being connected to the shorting links 202. However in this embodiment, the shorting structure 201 is optional. Regardless of whether the shorting structure 201 (or the shorting links 202 shown connecting the shorting structure 201 to the bond pads 206) is present or not, the shorting links 202 between the output bond pads 206 make a single shorting circuit. The single shorting circuit is connected to each conductive lead 205, thereby assuring that all the leads, and hence all the electronic devices they are connected to, are at the same electrostatic level.

After the shorting links 202 are applied at step 320, the electronic device being fabricated by process 300 is in a partially fabricated state where it is protected from ESD. A partially fabricated electronic device protected from ESD may be a deliverable product that can be included in the manufacture of another device that the partially fabricated device is a part of. While in this partially fabricated and protected state, the device may be tested to assure at all elements are operational. As long as the shorting links 202 remain, the elements, e.g., the interferometric modulators of display array 30, are protected against ESD. A device that is in this ESD protected state after completion of step 320 will be referred to herein as being a partially fabricated device.

Process 300 continues at step 325, where the ESD protection is disabled by removing at least a portion of the shorting links 202 and/or the shorting structure 201 (if a shorting structure is present). The removal may comprise chemical etching, laser etching or electrically fusing the shorting links and/or the shorting structure. Laser etching may damage the substrate 20 and therefore may not be suitable for display devices where the substrate 20 serves as a viewing window.

Figure 11C:
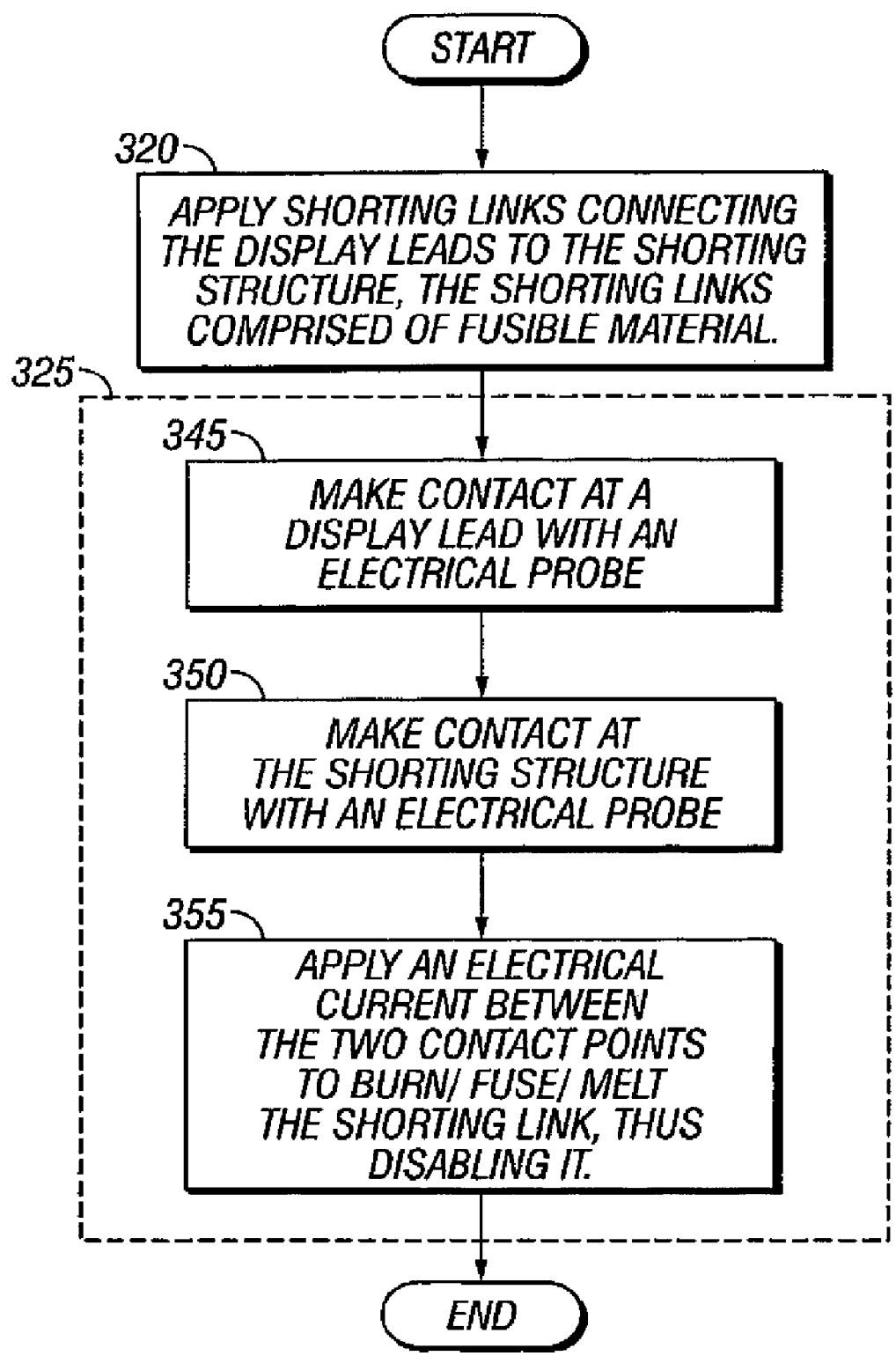

In one embodiment, the shorting links 202 and/or the shorting structure 201 are comprised of a fusible material. The fusible material may include nickel, aluminum or molybdenum. FIG. 11c shows alternative acts for performing steps 320 and 325 in process 300 for this embodiment. At step 320 in FIG. 11c, the fusible shorting links 202 are applied to the substrate 20. Step 325, where the shorting links 202 and/or shorting structure 201 are at least partially removed, is performed in three sub-steps, steps 345, 350 and 355. At step 345, a probe is contacted at one of the conductive leads (e.g., a display lead in this embodiment). At step 350, another probe is contacted at the shorting structure 201. At step 355, an electrical current is applied between the two probes. The electrical current is sufficient to burn, fuse, and/or melt the shorting link between the two probes, thus disabling it. In one embodiment, the steps 345, 350 and 355 shown in FIG. 11e are performed utilizing testing equipment that was used to verify the operational requirements of the electronic device being afforded ESD protection.

The electrical current applied at step 355 may be applied for a length of time sufficient to fuse at least the shorting link between the probes. If the shorting links 202 are thin enough, more than one shorting link (possibly all the shorting links 202) may be fused at a time by a single fusing current. In one embodiment, the shorting links 202 are less than about one micron in at least one point.

The shorting links 202 may be fused one at a time in order to keep the accumulated heat low so as not to damage other components.

In the embodiment depicted in FIG. 10, the shorting links 202 are connected between output bond pads 206. If fusible shorting links are located between the output bond pads 206, there could be some damage to the output bond pads 206 and/or the conductive leads 205 due to heat and/or residue as a result of fusing the shorting links 202.

Figure 12G:
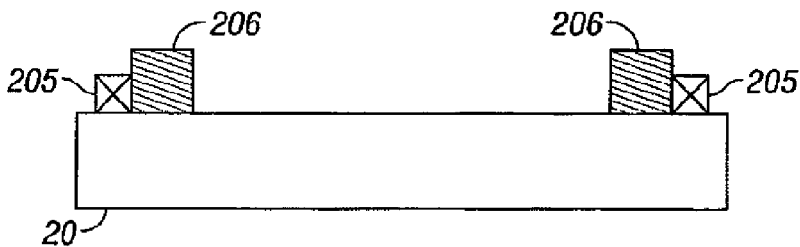

In another embodiment, the shorting links and/or the shorting structure are comprised of etchable material. In this embodiment, an etch-stop 210 may be applied to conductive leads 205 and/or output bond pads 206 in the vicinity of the shorting links 202 and/or the shorting structure 201, as depicted schematically in FIG. 12e. The etch-stop 210 may be a photo resist. The etch stop 210 serves to prevent the conductive leads 205 and output bond pads 206 from being removed while the shorting links 202 and/or shorting structure 201 are etched, resulting in the structure illustrated in FIG. 12f. For example, an etchable conductive material such as molybdenum may be removed by dry chemical etching, e.g., by exposing the sacrificial layer to a gaseous or vaporous etchant, such as vapors derived from solid xenon difluoride ($XeF_2$) for a period of time that is effective to remove the desired amount of material. The amount of etch stop 210 formed over the conductive leads 205 and/or output bond pads 206 should be enough such that the conductive leads 205 and the output bond pads 206 remain mostly intact. This is depicted in FIG. 12g where the etch stop 210 has been removed while the conductive leads 205 and output bond pads 206 remain. Other etching methods, e.g. wet etching and/or plasma etching, may also be used.

Another embodiment for preparing and removing a shorting structure comprises a masking step to protect the shorting structure (a ring, for example) during an etch process prior to encapsulation (e.g., sealing and packaging with a cover glass that seals the active electronic device). Such an etch step is typically used in forming the cavity 19 of FIG. 1, and is typically highly selective in nature. By masking the shorting structure only during such an etch step allows the structure to be formed by the same conductive film that occupies the cavity prior to its removal. A subsequent similar etch step without said masking, and after the encapsulation of the electronic device then effectively removes the shorting structure. Examples of masking that may be used in this embodiment include coating of a photo resist, or printing a protect coating on the shorting structure area. Since the shorting structure geometry may be fairly large, the masking may not require a high precision photolithography, but it may be used if convenient. This embodiment is convenient for implementing in a process sequence where a cavity is to be formed. An example structure for such implementation is an interferometric device.

In one embodiment, as depicted in FIG. 9, the shorting links 202 are all connected at one end to a common shorting structure 201. The shorting structure may be removed by etching while leaving most of the shorting links 202 intact. Since the shorting links 202 are all connected at one end to the shorting structure 201, the shorting links 202 are all disabled by removal of the shorting structure 201.

Figure 12H:
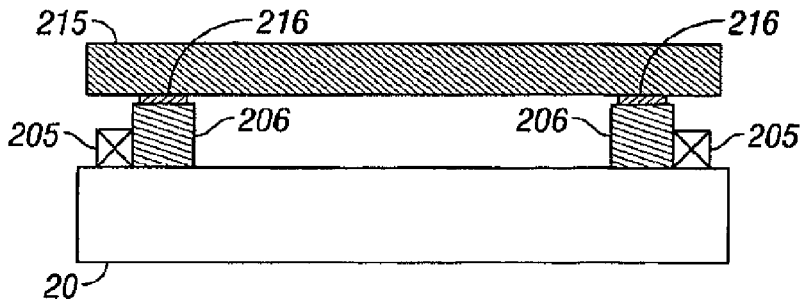

Step 325 (or steps 345, 350 and 355 in certain embodiments) may be performed just prior to attaching a microchip 215 (depicted schematically in FIG. 12h) to the substrate at step 330. In this way, the electronic device is protected from ESD as long as possible. The shorting links are disabled in step 325 as discussed above, thereby no longer providing ESD protection, but permitting electrical signals to pass to the appropriate conductive leads and thereby enabling proper driving of the electronic device. FIG. 12h depicts output contacts 216 on the microchip bonded to the output bond pads 206. Depending on the embodiment, selected steps of process 300 illustrated in FIG. 11 and depicted schematically in FIG. 12 may be removed, added or rearranged.

An embodiment of partially fabricated display device includes means for displaying image data, means for electrically connecting the displaying means, and means for shorting the electrical connecting means, wherein the shorting means is configured to be disabled by an electrical current capable of fusing the shorting means. With reference to FIG. 9, aspects of this embodiment include where the displaying means is display array 30, where the electrical connecting means are conductive leads 205, and where shorting means are shorting links 202.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of providing electrostatic discharge protection during a fabrication process of a micro-electronic device, wherein the microelectronic device comprises an array of electronic devices on a substrate, the method comprising:
   applying a plurality of conductive leads to the substrate, wherein the leads connect to the electronic devices;
   applying an electrically conductive material to the substrate to serve as a shorting structure;
   applying shorting links to the substrate, wherein the shorting links are comprised of an electrically conductive material and are in electrical connection to the conductive leads and the shorting structure; and
   wherein the shorting structure is at least partially located in an area of the substrate to attach a microchip and at least one of the group of shorting links or the shorting structure is configured so as to be at least partially removable.

2. The method of claim 1, further comprising applying bond pads in the area of the substrate to attach the microchip.

3. The method of claim 2, further comprising bonding an electronic device to the bond pads.

4. The method of claim 1, further comprising removing at least a portion of the shorting structure or a portion of the group of shorting links, thus disabling the group of shorting links.

5. The method of claim 4, wherein the removing comprises at least one of chemical etching, wet etching, plasma etching, laser etching, and electrical fusing.

6. The method of claim 1, wherein the group of shorting links comprises a fusible material.

7. The method of claim 6, further comprising applying an electrical current across one of the shorting links, the electrical current being sufficient to fuse the shorting link, thus disabling the shorting link.

8. The method of claim 1, wherein the shorting structure comprises an etchable material.

9. The method of claim 8, further comprising:
   applying an etch-stop material to at least a portion of the conductive leads and the bond pads; and
   etching at least a portion of the shorting structure, thus disabling the group of shorting links.

10. A method of providing electrostatic discharge protection during a fabrication process of a micro-electronic device, wherein the microelectronic device comprises an array of electronic devices on a substrate, the method comprising:
    applying a plurality of conductive leads to the substrate, wherein the leads connect to the electronic devices; and
    applying shorting links to the substrate in electrical connection with the conductive leads and configuring the shorting links such that all of the conductive leads are connected to a single shorting circuit, wherein the shorting links are comprised of fusible material and are configured so as to be disabled by an electrical current capable of fusing the shorting links.

11. The method of claim 10, further comprising:
    applying an electrically conductive material to the substrate to serve as a shorting structure; and
    wherein the shorting links are in electrical connection with the conductive leads and the shorting structure.

12. The method of claim 10, further comprising applying an electrical current across one of the shorting links, the electrical current being sufficient to fuse the shorting link, thus disabling the shorting link.

13. The method of claim 10, further comprising applying an electrical current across one of the shorting links, the electrical current being sufficient to fuse the shorting link, thus disabling the shorting link.

14. The method of claim 10, further comprising applying an electrical current across all of the shorting links, the electrical current being sufficient to fuse all of the shorting links, thus disabling the shorting circuit.

* * * * *